(12) United States Patent
Cole

(10) Patent No.: US 6,838,306 B2
(45) Date of Patent: Jan. 4, 2005

(54) INFRARED DETECTOR PACKAGED WITH IMPROVED ANTIREFLECTION ELEMENT

(75) Inventor: Barrett E. Cole, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/628,849

(22) Filed: Jul. 28, 2003

(65) Prior Publication Data

US 2004/0072384 A1 Apr. 15, 2004

Related U.S. Application Data

(62) Division of application No. 09/751,611, filed on Dec. 29, 2000, now Pat. No. 6,627,892.

(51) Int. Cl.[7] ............................................. H01L 21/00
(52) U.S. Cl. ........................................................ 438/65
(58) Field of Search ............................. 438/65, 64, 57; 359/580, 566; 250/338

(56) References Cited

U.S. PATENT DOCUMENTS

| | | | |
|---|---|---|---|
| 4,536,608 A | 8/1985 | Sheng et al. | 136/259 |
| 4,554,727 A | 11/1985 | Deckman et al. | 29/572 |
| 4,760,440 A | 7/1988 | Bigler et al. | 357/74 |
| 4,826,267 A | 5/1989 | Hall et al. | 350/1.6 |
| 5,151,917 A | 9/1992 | Perilloux et al. | 372/102 |
| 5,417,799 A | 5/1995 | Daley et al. | 216/24 |
| 5,895,233 A | 4/1999 | Higashi et al. | 438/107 |
| 6,359,735 B1 | 3/2002 | Gombert et al. | 359/580 |
| 6,384,473 B1 | 5/2002 | Peterson et al. | 257/680 |
| 6,627,892 B2 * | 9/2003 | Cole | 250/338.1 |

FOREIGN PATENT DOCUMENTS

WO    WO-95/17014    6/1995    ....... H01L/31/0203

OTHER PUBLICATIONS

Kwa, T. A., et al., "Integrated Grating/Detector Array Fabricated in Silicon Using Micromachining Techniques", *Sensors and Actuators A, 31*, (1992),256–266.

Motamedi, M. E., et al., "Antireflection surfaces in silicon using binary optics technology", *Applied Optics, 31(22)*, (Aug. 1992),pp. 4371–4376.

\* cited by examiner

*Primary Examiner*—Michael Tokar
*Assistant Examiner*—Monica D. Harrison
(74) *Attorney, Agent, or Firm*—Kris T. Fredrick

(57) ABSTRACT

An infrared detector has a window in a cover having a cavity for exposing detector pixels to incident radiation. The window has an antireflective element formed within the cavity as a field of posts. The field of post structures is formed in a cavity by etching the posts in a desired pattern first, and forming the cavity by a general etch over the whole field afterward.

19 Claims, 5 Drawing Sheets

INFRARED DETECTOR PACKAGED WITH IMPROVED ANTIREFLECTION ELEMENT

This is a divisional of U.S. application Ser. No. 09/751,611 filed Dec. 29, 2000 now U.S. Pat. No. 6,627,892 which is incorporated herein by reference.

TECHNICAL FIELD

The present invention concerns thermal imaging, and more specifically concerns structures and methods for packaging arrays of infrared detectors.

BACKGROUND

Night vision and related applications can be realized by receiving the infrared radiation emitted by warm bodies in an array of uncooled bolometer pixels or other detector whose electrical output signals are converted into a visible image.

An array of uncooled bolometers or similar detector on a semiconductor substrate must be packaged so as to protect the detector pixels from contamination and degradation. Many conventional integrated-circuit packaging techniques are not suitable because the face of the array must be exposed to incident radiation.

A package cover can be fabricated from a material that transmits infrared, such as silicon, to provide a window for a detector array. A cavity can be micromachined into the cover so that the cover can be sealed to a substrate holding the array. Evacuating the sealed cavity produces a vacuum that protects the array pixels and their circuitry on the substrate.

The high indices of refraction of infrared optical components causes large insertion losses. Many conventional infrared-detector packages employ antireflection layers or coatings for reducing insertion losses to a more acceptable level. However, when the optical element is a window formed in a cavity, applying an effective antireflective element within the cavity is difficult. In addition to the performance degradation from the high temperatures required for many such coatings, it is difficult to achieve uniformity in a depressed surface such as a cavity.

SUMMARY

An infrared detector according to the invention has a window in a cover having a cavity for exposing one or more detector pixels to incident radiation. The window has an antireflective element formed within the cavity as a field of posts having a height, spacing, and fill factor for achieving the desired optical effect in a wavelength range of interest.

In another aspect, the invention concerns fabricating an infrared optical element. A field of post structures is formed in a cavity by etching the posts in a desired pattern and forming the cavity by a general etch over the area of the field.

DRAWINGS

DETAILED DESCRIPTION

Figure 1:
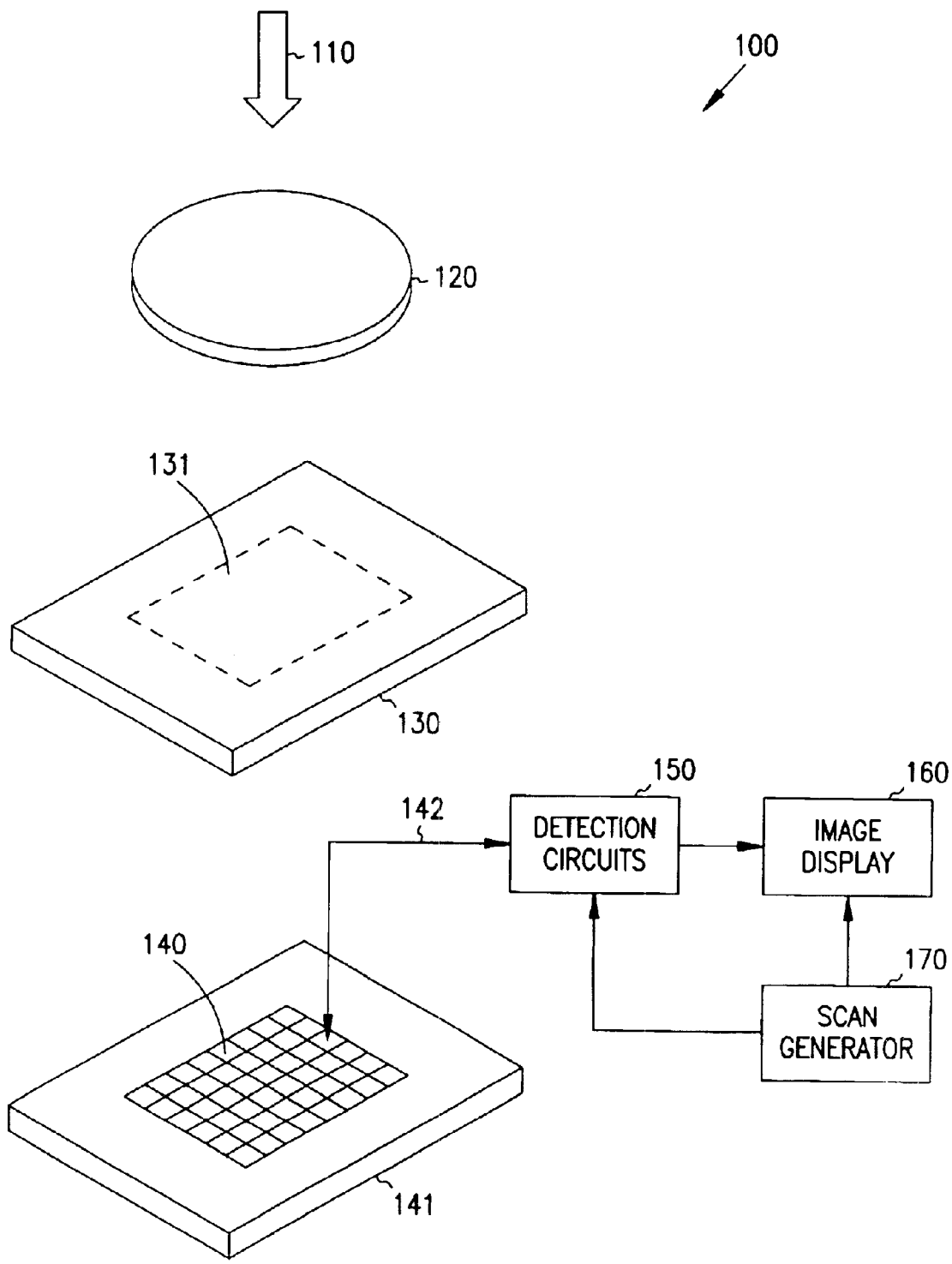
FIG. 1 shows an infrared detector having a package according to the invention.

FIG. 1 is a stylized exploded view of a representative infrared imaging detector 100 according to the invention. Arrow 110 represents infrared radiation produced by a warm body and transmitted to infrared imaging optics 120 of conventional design. Package cover 130 has a window area 131 transparent to infrared wavelengths for transmitting radiation 110. Sealing package 130 and evacuating the atmosphere therefrom is desirable in many applications to increase sensitivity and inter-pixel isolation, and to reduce contamination and degradation.

Bolometer array 140 within package 130 is fabricated on a substrate 141 of silicon or similar material having appropriate electrical and micromachining properties. (Alternatively, array 140 can be mounted upon a separate substrate 141.) Individual pixels such as 200 are commonly disposed in rows and columns of a rectangular matrix, although a single line and other configurations are also employed. In many applications, array 140 operates at ambient temperatures, e.g., in the approximate range of −40° C. to +100° C. It is possible, however, to operate the array at much lower temperatures, e.g., below about 2K to 20K, either by cooling the array or by operating it in an environment such as space. Row and column wiring 142 reads out the electrical signals representing the temperature of each individual pixel such as 200, and may also introduce scanning signals for time-multiplexing the pixel signals.

Detection circuits 150 process an image signal from detector 140, performing functions such as amplifying and demultiplexing the pixel signals. Unit 160 receives the processed signals and presents a visible image to a viewer. In other embodiments, unit 160 might be replaced or augmented by a recorder or other device for storing signals representing one or more successive images, or for other processing of the signals; the term "display" will be taken broadly to include any or all of these functions. Scan generator 170 can be included for multiplexing the pixel signals and/or for controlling the display or processing of images on unit 160. System 100 represents an example environment for the present invention; others are possible.

Figure 2:
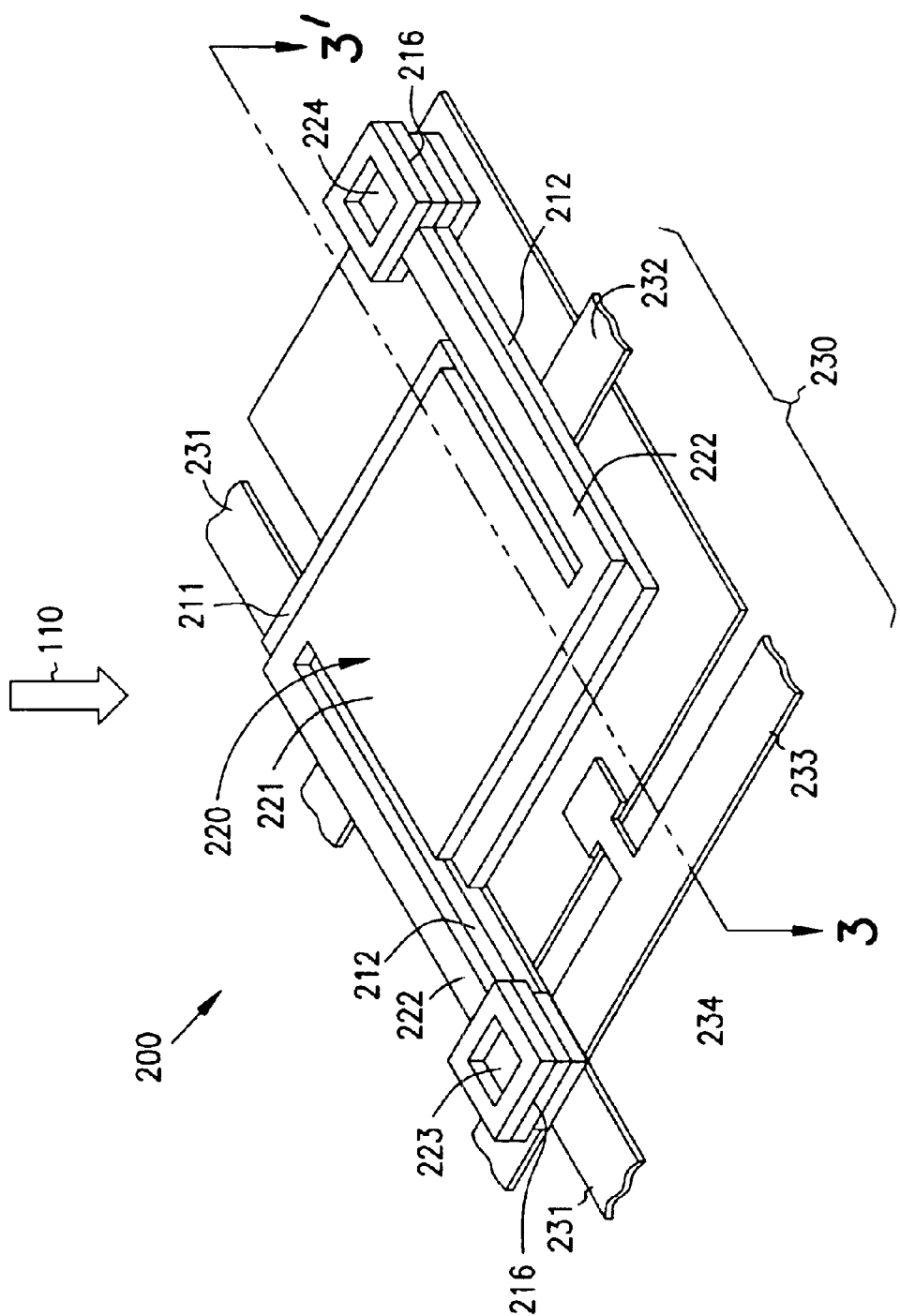
FIG. 2 is an isometric view of one of the pixels of FIG. 1.

FIG. 2 details a typical pixel 200 of array 140, FIG. 1. A thermally isolated platform 210 absorbs incident radiation. Resistor 220 has a high coefficient of resistance change with temperature and is in thermal contact with platform 210, so that its resistance indicates the temperature rise caused by the radiation. Conductors 230 carry voltages and signals. For example, conductors 231 and 232 provide supply and return current to resistor 220. Address line 233 activates the pixel to output a signal from resistor 220 that represents the temperature increase of the pixel caused by the incident radiation. Pixel design can vary considerably; the invention is also useful with other types of infrared detectors, such as pyrometers. A typical array 140 might have 120×160 detectors.

Figure 3:
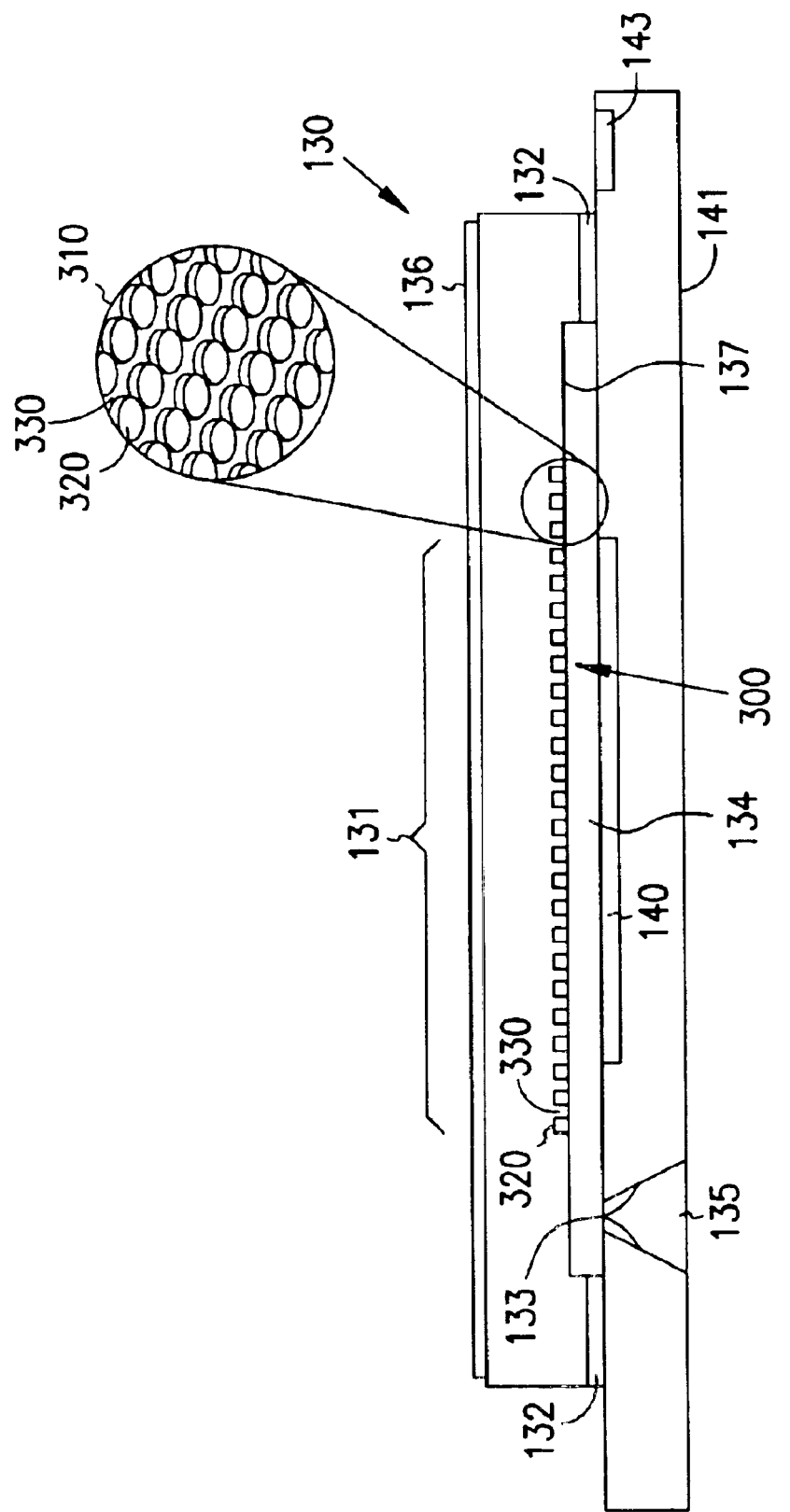
FIG. 3 is a cross section of the package of FIG. 1, taken along line 3–3' in FIG. 1.

FIG. 3 is a cross section of package cover 130 assembled to detector array 140. In this example, elements 130 and 140 are silicon wafers about 10 cm square and 0.5 mm thick, although other suitable materials and dimensions can be employed. Window area 131 is indicated by arrows in FIG. 3; silicon transmits long-wave infrared (LWIR) well. The depth of cavity 134 can vary; in this example it is about 100 μm. An acceptable range extends from nearly 500 μm to 0 μm; that is, in some configurations it is possible to eliminate the cavity altogrther. A conventional perimeter seal 132 hermetically joins cover 130 to substrate 141. Port 133 allows cavity 134 to be evacuated so as to protect array 140 against atmospheric contamination and degradation, and, most importantly, to minimize signal loss from air conductance. Seal 135 maintains the vacuum in cavity 134. The top outside surface of cover 130 has an antireflection coating or layer 136 to prevent reflection of incident radiation 110 from. The material and thickness of coating 136 depends upon the wavelengths desired to be affected; for long-wave infrared, the embodiment of FIG. 3 uses a multilayer film having a thickness of more than 1 μm. Contact pads 143 couple array 140 to external wiring 142, FIG. 1.

Recessed interior cavity surface 137 of package cover 130 also has an antireflection element, indicated generally at 300, extending at least over the area above the detector array, and preferably over a greater area of cavity surface 137. Element 300 is a field 310 of upstanding posts 320 extending from a ground 330 below the level of surface 137. Posts 320 are shown as right circular cylinders, and are arranged in a rectangular matrix of rows and columns in field 310. The dimensions and spacing (periodicity) of posts 320 depends upon the refraction index of the window material and the wavelength band of the incident radiation 110 desired to be detected. To approximate a quarter-wavelength antireflective layer, the height of the posts is about h=λ/(4n), where λ is the approximate center of the wavelength band of interest, and n is the effective index of refraction of field 310. Post height is typically in the range of 0.2 μm to 4 μm, corresponding to band centers from 3 to 60 μm. To avoid reflection at surface 137, it is desirable to make n=√$n_w$, where $n_w$ is the index of the solid window material. Because posts 320 are arranged in a pattern having symmetry in two orthogonal directions, n is anisotropic. The antireflective properties of field 310 are then the same for all polarizations of radiation 110. The pattern could also have other shapes; for example, hexagonal posts permit higher packing density within field 310.

In this example, the tops of the posts are flush with interior surface 137 of the cavity, and their bottoms, the ground level, lie below that surface. Alternatively, the posts can be fabricated as holes extending below interior surface 137, having substantially the same cross-sectional area as the posts. The term "posts" will be employed herein to denote both upstanding posts and depressed holes. The shapes of the posts (or holes) can be round, square, rectangular, or have any other convenient cross section. It is also possible to fabricate posts (or holes) having a non-vertical sidewalls; that is, the posts can be shaped to provide a varying cross section along their height, such as substantially pyramidal or conical, including frustum and other variations of these shapes where the cross section decreases along the height of the posts (or, equivalently, depth of holes). Although more difficult to fabricate, such posts offer enhanced antireflection performance over a wider range of wavelengths.

A desired effective index n of field 310 depends upon $n_w$ and upon the fill factor or relative area $A=A_p/A_f$ of the posts $A_p$ to the total field $A_f$. In "Antireflection Surfaces in Silicon Using Binary Optics Technology" (APPLIED OPTICS, Vol. 31, No. 2, 1 Aug. 1992), Motamedi et al. derive an approximate relation for the effective index as:

$$n = \left( \frac{[1 - A + An_w^2][A + (1 - A)n_w^2] + n_w^2}{2[A + (1 - A)n_w^2]} \right)^{1/2}$$

For round pillars of diameter d and center-to-center spacing s, $A=(\pi/4)(d/s)^2$. The relative area of other shapes is easily calculated. For silicon, the fill factor can range from about 20% to about 60%, being about 40% in this example. Post spacing or periodicity should be less than any wavelength in the desired band to avoid diffraction and scatter; for a rectangular array, this is also the spacing between adjacent rows and columns. The lowest spacing is determined by process limitations rather than by optical considerations. For a silicon cover 130 and a detector 140 operating in the wave band of about 6–12 μm, square posts of side 1.5 μm can be spaced 2.3 μm apart.

Figure 4:
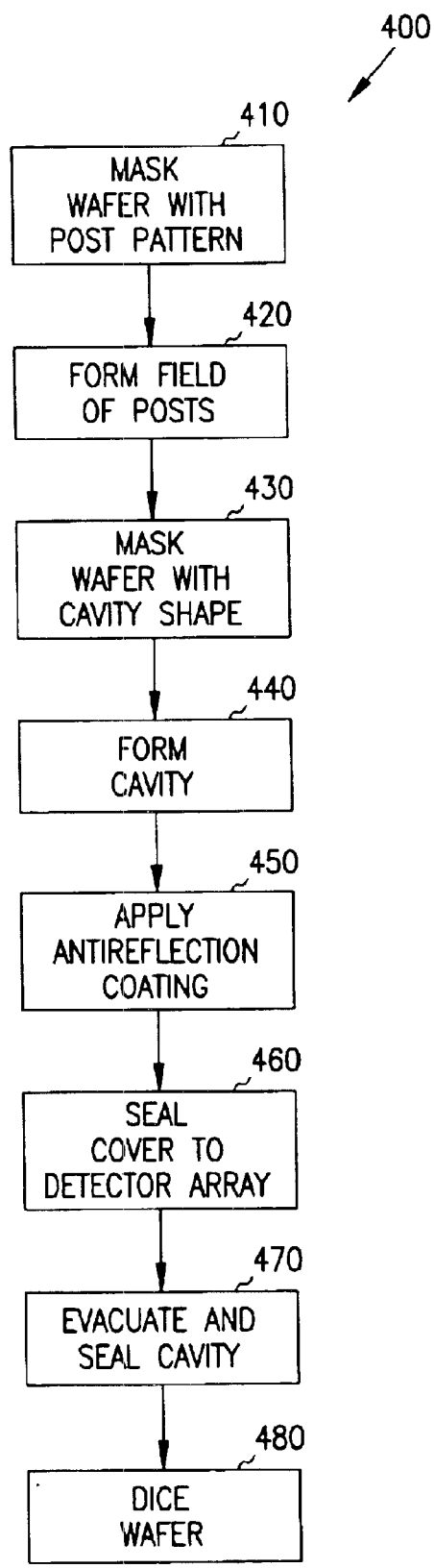
FIG. 4 is a flowchart of a method for making a detector package according to the invention.

FIG. 4 shows the method 400 of forming the package cover 130 of FIGS. 1 and 3. In block 410, a mask having the pattern of field 310 is applied to a surface of a flat wafer. In the example described, the wafer is made of silicon and is about 0.5 mm thick. The pattern is aligned so as to produce areas of resist having the shape or cross-section of posts 320 in the desired region of window 132.

Block 420 forms the field of posts by etching. The term "etching" is employed here in a broad sense of material removal. Reactive ion etching (RIE) is typically desirable, because the ions can form relatively tall structures of small cross section. In this example, the posts are about 0.7 μm deep (λ/4n at 9 μm wavelength), and pitch is about 2.3 μm. Typically, pitch/height ratio is in the range of 2 to 20, ratios toward the smaller end of the range being preferable.

Block 430 applies a mask having the shape of the entire cavity 134 to the wafer surface that was etched in block 420. This mask has resist only in the perimeter region of cover 130, such as the area where seal 132 is placed in FIG. 1. The purpose of this mask is to define the boundary of cavity 137.

Block 440 etches the entire area of cavity 134, including the field 310 containing posts 320. A typical cavity depth is about 100 μm. Again, an RIE process allows the cavity to form without significantly undercutting or otherwise degrading the shapes of the posts. Because the tops of the posts and the ground surface of the field are etched substantially equally, the effect is to sink field 310 of posts 320 into a cavity, rather than to etch it at the bottom of an already formed cavity. This is advantageous because it is easier to form fine features such as posts (or holes) on a planar surface without a cavity. After this etching operation, the tops of the posts 320 lie approximately even with the bottom surface 137 of cavity 134.

Block 450 applies antireflection coating 136 to the other (top) surface of package cover 130. In the applications envisaged by this example embodiment, coating 136 may be a 1 μm layer of $Y_2O_3$, or a multilayer coating. Alternatively, however, antireflection element 136 can be a further field of posts of the same kind as field 310, formed in the same manner, but upon the top surface of cover 130, in the area of window 131. In this case, operations 410 and 420 are repeated within block 450 upon the top surface of cover 130.

In block 460, package cover 130 is sealed to substrate 141, FIG. 1. Solder, indium, or indium-lead can be employed as an airtight seal. In block 470, the ambient atmosphere is evacuated from cavity 134, and a vacuum-deposited plug 135 seals port 133. A residual pressure typically less than about 1 mTorr in the cavity is sufficient to prevent signal loss and to protect detector array 140.

Many arrays can be fabricated and sealed together at the same time. The wafer then contains multiple patterns, and the substrate contains a corresponding number of detector arrays. Theses can be sealed together and evacuated as a single unit. Block 480 then dices such a wafer into indicvidual packages each containing a single array. This lowers handling effort and costs.

Figure 5:
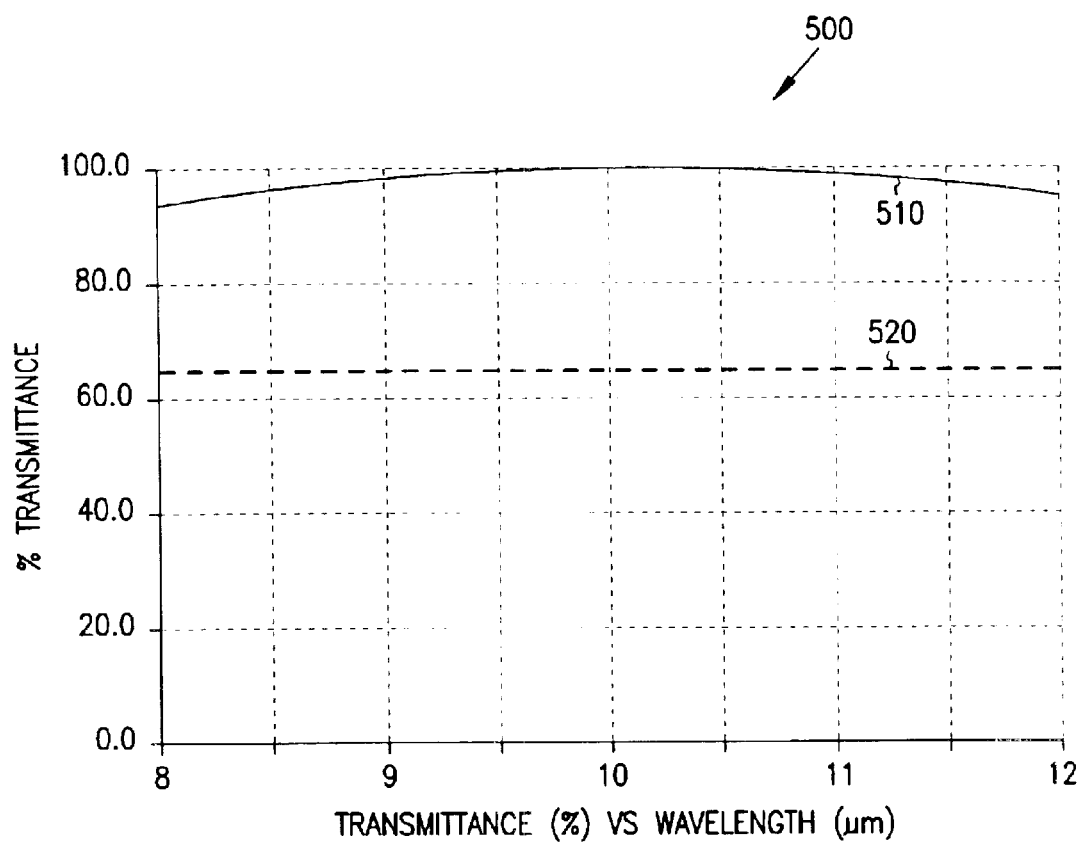
FIG. 5 is a graph of the transmittance of the window of FIGS. 1 and 3 over a range of wavelengths.

FIG. 5 is a graph 500 showing transmittance normalized relative over the band of 6 μm to 12 μm in the near infrared. Curve 510 depicts the transmittance of window_ constructed according to the invention. Curve 520 shows the same window, but without an antireflective coating on the interior surface of cavity 134. Without any interior antireflection element, the window has only about 65% of the transmittance obtainable with the invention. The post structure causes response to vary less than 5% over the wavelengths of interest.

Conclusion

The invention present an infrared optical device having a cavity structure. An antireflection structure having a pattern of posts significantly enhances the transmissivity of the device. The field of posts is formed prior to formation of the cavity itself.

What is claimed is:

1. A method for fabricating an infrared optical element from a wafer of material capable of transmitting infrared radiation therethrough, comprising, in the order listed:

masking a surface of the wafer with a pattern defining a cross section of a field of posts;

etching the wafer surface so as to form the field of posts to a desired depth;

masking the field of posts with a shape defining a cavity in the surface of the wafer;

etching the wafer surface including the field of posts so as to form a cavity in the wafer.

2. The method of claim 1 where the second etching operation is performed such that the tops of the posts lie below the surface of the cavity.

3. The method of claim 1 where the second etching operation is performed such that tops of the posts are approximately flush with a bottom surface of the cavity.

4. The method of claim 1 where the second etching operation is performed such that bottoms of the posts lie below a bottom surface of the cavity.

5. The method of claim 1 where the cross section of the posts varies along their height.

6. The method of claim 5 where the cross section decreases along the height.

7. The method of claim 1 where the first etching operation is a reactive ion etch.

8. The method of claim 7 where the second etching operation is a reactive ion etch.

9. The method of claim 1 where the height of the posts after the second etching operation is in the approximate range of 0.5 μm to 4 μm.

10. The method of claim 1 further comprising applying an antireflection layer to a side of the wafer opposite the cavity.

11. The method of claim 1 further comprising mounting an infrared detector to the wafer so as to receive incident infrared radiation through the wafer.

12. The method of claim 11 where the infrared detector is an array of bolometer pixels.

13. The method of claim 11 further comprising mounting the detector to the wafer.

14. The method of claim 13 wherein the detector is hermetically sealed to the wafer.

15. The method of claim 13 further comprising evacuating the cavity.

16. A method for fabricating an infrared optical device, comprising:

masking a surface of a wafer of material capable of transmitting infrared radiation therethrough with a pattern defining a field of posts;

etching the wafer surface so as to form the field of posts to a desired height;

applying an antireflection element to the other surace of the wafer;

sealing the wafer to a substrate containing an array of bolometers.

17. The method of claim 16 further comprising evacuating a space between the wafer and the substrate.

18. The method of claim 16 where the posts have varying cross section along their height.

19. The method of claim 16 further comprising:

performing the above operations for a plurality of infrared optical devices on the same wafer;

dicing the wafer after sealing it to the substrate containing multiple arrays of bolometers;

thereafter, dicing the wafer and the substrate to separate individual ones of the devices.

* * * * *